(12) United States Patent
Hsu et al.

(10) Patent No.: US 6,419,804 B1
(45) Date of Patent: Jul. 16, 2002

(54) CONTAMINATION-RESISTANT THIN FILM DEPOSITION METHOD

(76) Inventors: Cheng-Shen Hsu; Tien-Tsai Lin, both of No. 13, Alley 6, Lane 167, Chung-Yi Road, Kuei-Shan Hsiang, Tau-Yuan Hsien (TW)

( * ) Notice: Subject to any disclaimer, the term of this patent is extended or adjusted under 35 U.S.C. 154(b) by 0 days.

(21) Appl. No.: 09/718,221

(22) Filed: Nov. 22, 2000

(51) Int. Cl.$^7$ ................................................ C23C 14/34
(52) U.S. Cl. ........................ 204/192.15; 204/192.12
(58) Field of Search ...................... 204/192.12, 192.15, 204/192.14, 298.12, 298.18

(56) References Cited

U.S. PATENT DOCUMENTS

| | | | | |
|---|---|---|---|---|
| 5,294,312 A | * | 3/1994 | Chin et al. ................ | 204/192.2 |
| 5,942,338 A | * | 8/1999 | Arbab et al. ................ | 428/623 |
| 5,972,527 A | * | 10/1999 | Kaijou et al. .......... | 204/192.15 |

FOREIGN PATENT DOCUMENTS

| | | | |
|---|---|---|---|
| JP | 05 166 794 A | * | 7/1993 |
| JP | 07 166 324 A | * | 6/1995 |

* cited by examiner

Primary Examiner—Nam Nguyen
Assistant Examiner—Gregg Cantelmo
(74) Attorney, Agent, or Firm—Jacobson Holman, PLLC

(57) ABSTRACT

A contamination-resistant thin film deposition method utilizing a reaction-type vacuum sputtering process in which an organic tetrafluoroethylene plastic and conductor substances are sputtered onto a substrate to deposit a thin film onto the substrate, with the thin film deriving its contamination-resistant capability from the anti-stick properties of the tetrafluoroethylene plastic and the anti-static properties of the conductor substances. The contamination-resistant thin film deposition method utilizes a configured tetrafluoroethylene plastic target structure that includes a negative substrate, a filiform electrode, an insulative support, a tetrafluoroethylene plastic sputtering substrate, a positive substrate, a tetrafluoroethylene plastic substrate rotating device, a magnetic field generator, and a gas input port. A 2 mm to 5 mm interval is left in between the positive substrate and the tetrafluoroethylene plastic substrate to facilitate the generation of a positive charge and effectively utilize the energy of the Faraday positive shaded region effect to invoke collisions off the tetrafluoroethylene plastic.

6 Claims, 4 Drawing Sheets

CONTAMINATION-RESISTANT THIN FILM DEPOSITION METHOD

BACKGROUND OF THE INVENTION

1) Field of the Invention

A contamination-resistant thin film deposition method utilizing the properties of tetrafluoroethylene, including the non-adhesive, low friction coefficient, weather-resistance, and extremely low surface energy as well as water and oil dispersing properties that makes the attraction of dust and grime difficult. However, since the high insulation capacity causes the generation of static electricity, the said method contains conductive ITO compound to lower the impedance to $10^9 \Omega$-cm so the tetrafluoroethylene becomes a semiconductor and thereby remedies the cause of substrate static electricity, allowing utilization in the construction material (including plastic wallpaper), glass window, precision instrument, optical industry, automotive materials, computer industry (DVD, CD, and VCD), medical treatment, and foods surface treatment industries.

2) Background of the Prior Art

In conventional vacuum reaction-type oxidized aluminum sputtering rate tests, by means of magnetically controlled direct current sputtering, the placement of magnetic field electrodes and magnetic field power, and the cross-sectional area ratio of the positively and negatively charged targets were adjusted to increase the sputtering rate. The positive and negative targets were aluminum materials, with an insulative tetrafluoroethylene plastic material separating the two electrodes. During sputtering, oxygen and argon oxidized into an aluminum deposition on a glass substrate. Following repeated tests, the resulting oxidized aluminum on the glass substrate was of a very high degree of hardness. A small drop of water was applied onto the said glass and it was observed that the water drop did not disperse, but remained a single globule of water that was easily blown off using a blast of air. Furthermore, the surface was extremely lubricated and an infrared spectroscope instrument verified the presence of aluminum oxide and tetrafluoroethylene plastic on the surface of the glass. A further examination of the tetrafluoroethylene plastic of the insulation substrate revealed that the condition of wear was close to the tetrafluoroethylene plastic of the positive substrate. There was no surface wear on the negative substrate and the changed condition is indicated in FIG. 4, which also verifies the effect of the high energy ion collisions that occurred in the positive Faraday dark regions. The positive and negative target materials were replaced with titanium, indium-tin alloy, indium-antimony alloy, tin-antimony alloy and zinc substrates, while the insulator substrate in between remained tetrafluoroethylene plastic. It was verified that the five compounds on the glass substrate were oxidized titanium and tetrafluoroethylene plastic compound, the ITO and tetrafluoroethylene plastic compound, the oxidized indium-antimony and tetrafluoroethylene plastic compound, the ATO and tetrafluoroethylene plastic compound, and the oxidized zinc and tetrafluoroethylene plastic compound. Following the said treatment of the glass plate, the following characteristics were found as follows: (1) Non-adhesiveness, (2) static resistance, (3) water and oil dispersancy, (4) a low friction coefficient, (5) corrosion resistance, (6) weather resistance, and (7) inflammability; which verifies that the contamination-resistant thin film deposition method of the invention herein provides for the good appearance, corrosion resistance, contamination resistance, and weather resistance production requirements of the construction material (including plastic wallpaper), glass window, precision instrument, optical industry, automotive materials, computer industry (DVD, CD, and VCD), medical treatment, and foods surface treatment industries.

DETAILED DESCRIPTION OF THE INVENTION

Figure 1:
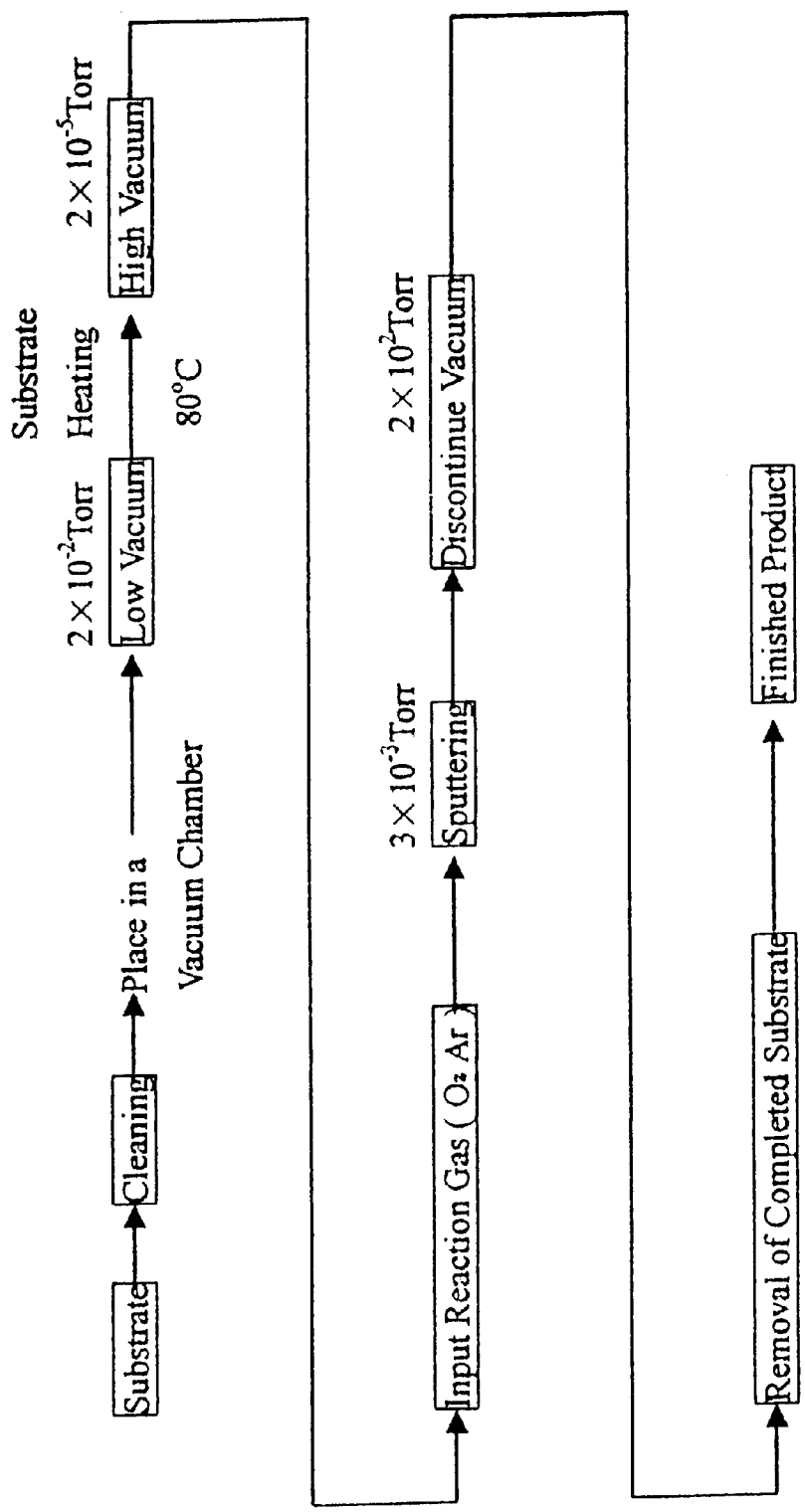
FIG. 1 is the production flowchart of the invention herein.
Figure 2:
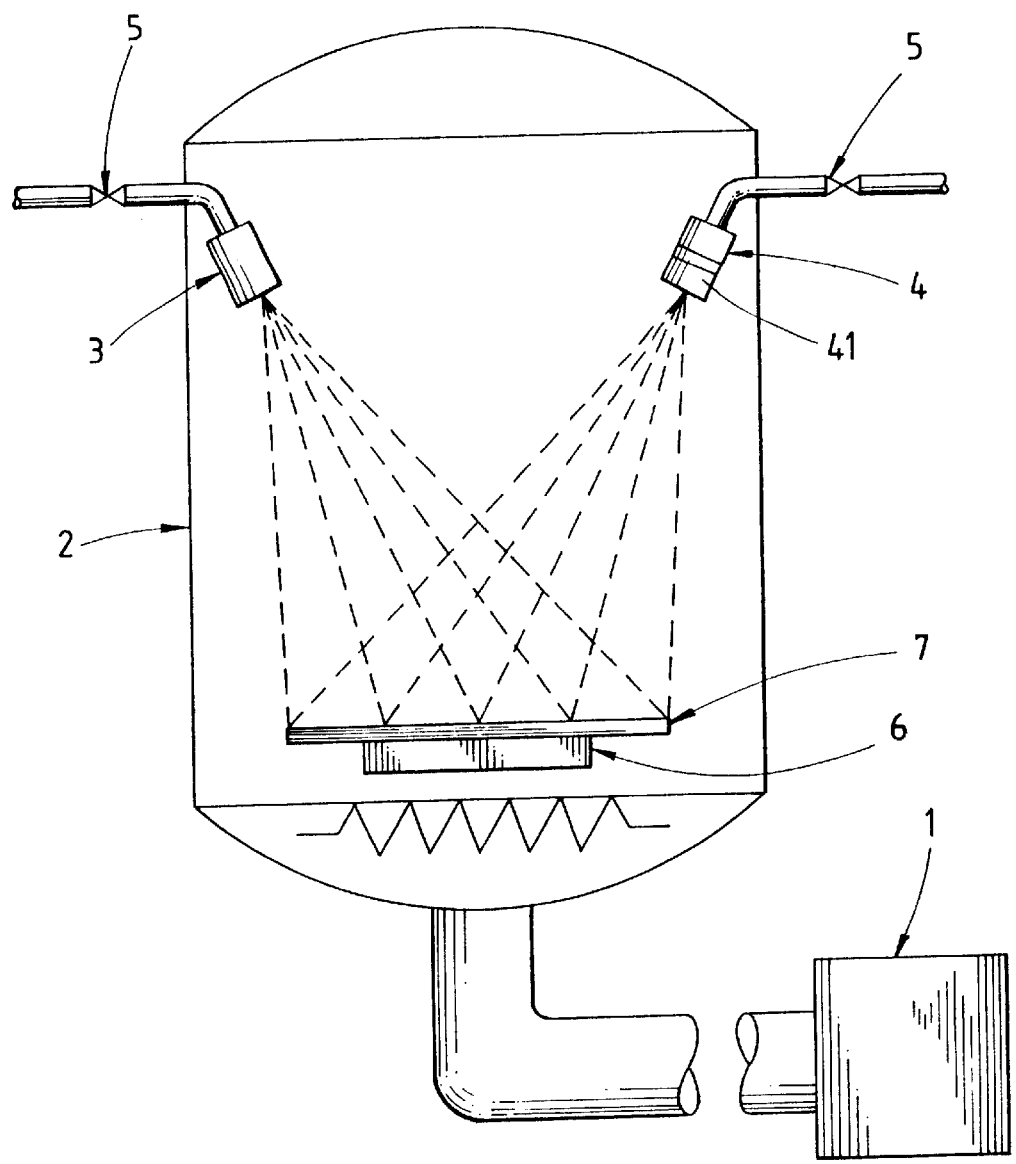
FIG. 2 is an orthographic drawing of the contamination-resistant thin film sputtering targets of the invention herein.

The contamination-resistant thin film deposition method of the invention herein is a reaction-type vacuum sputtering process that applies a surface layer over the substrate utilizing an contamination-resistant thin film deposition method and the equipment involved, as indicated in FIG. 2, consists of a vacuum pump 1, a vacuum chamber 2, a tetrafluoroethylene plastic sputtering target 3, a transparent conductor (such as ITO, ATO, ZnO, or $TiO_2$) sputtering target 4, a gaseous ($O_2$, Ar) flow rate controller 5, and a substrate application platform 6. Referring to FIG. 1, the fabrication process involves first the ultrasonic cleaning of the ferrous, non-ferrous, glass, ceramic, plastic or natural stone material substrate 7 on which the deposition is to be sputtered; next, the cleaned substrate 7 is placed on the application platform 6 (depicted in the drawing) inside the vacuum chamber 2, and then the said vacuum pump 1 is switched on to discharge air to a pressure of $1 \times 10^{-5}$ Torr; under high vacuum conditions in the said vacuum chamber 2, the flow rate controller 5 admits oxygen ($O_2$)and equal argon (Ar) gas into the vacuum chamber 2 to maintain an equilibrium pressure of $3 \times 10^{-3}$ Torr; the respective driving current and voltage for the tetrafluoroethylene plastic sputtering target 3 and the ITO sputtering target 4 is turned on to control the sputtering rate (the sputtering rates of 3 and 4 are individually controllable because each has a respective driving current) of the said two sputtering targets, which completes the presetting mole ratio and enables the deposition of the contamination-resistant thin film layer $(CF_2 \cdot CF_2)$ m(ITO)n onto the surface of the substrate 7; following completion of the deposition, the power supply of the two sputtering targets 3 and 4 are switched off and the $O_2$ and Ar gas admissions are ceased (terminated) and, furthermore, air is allowed to enter the said vacuum chamber 2 to discontinue the vacuum; finally, the completed item is taken out, inspected, and packaged as a finished product.

The said procedures of the contamination-resistant thin film deposition method can be followed to apply a high functionality, corrosion-resistant, and contamination-resistant surface treatment to improve the ferrous or non-ferrous, ceramic, glass, stone and plastic material of the substrate 7; and it can also be utilized in the construction materials (including plastic wallpaper), automotive production, precision machinery, optics, optoelectronics, computer screen, optical disk, and instrument industries to increase product performance, extend usable service life and, furthermore, reduce both maintenance time and cost.

In the said method, since a filiform electrode 32 is added during the sputtering of the tetrafluoroethylene plastic and ITO, a very low voltage can be utilized for sputtering and, furthermore, the tetrafluoroethylene plastic sputtering rate is quite rapid and, as a result, the ITO ratio is maintained at a lower value in the thin film mole ratio; to effectively control the tetrafluoroethylene plastic and ITO mole ratio, a planar magnetic ITO sputter controller equipped with a stack-shaped tube 41 must be additionally utilized to prevent heat dissipation; and any $(CF_2 \cdot CF_2)m(ITO)n$ ratio can be achieved when the aforesaid devices are utilized, as indicated in FIG. 2, to control the respective sputtering rate. [Note: $(CF_2 \cdot CF_2)m$ is the tetrafluoroethylene plastic mole ratio; $(ITO)n$ is the indium tin oxide mole ratio.]

The thin film deposition achieved by utilizing the said equipment has non-adhesive, anti-static, water and oil dispersing, chemical-resistant, corrosion-resistant, weather-resistant, lubricating, and high temperature-resistant (up to 325° C.) properties; furthermore, utilizing the oxygen and argon electrophoretic gel of the vacuum sputtering greatly increases the surface energy to improve the surface contact capability of the substrate, and such a sputtered deposition on a ferrous, non-ferrous, glass, ceramic, stone material substrate surface can achieve the objectives of both contamination and corrosion resistance; the most outstanding corrosion-resistant surface coatings on the current market are improved variations of tetrafluoroethylene such as TFE, FEP, CTFE, and PVDF, which are solvent-based corrosion-resistant coatings, however, the service life is relatively short because of the minute holes that appear during the drying process due to the organic suspension solvents utilized.

Figure 3:
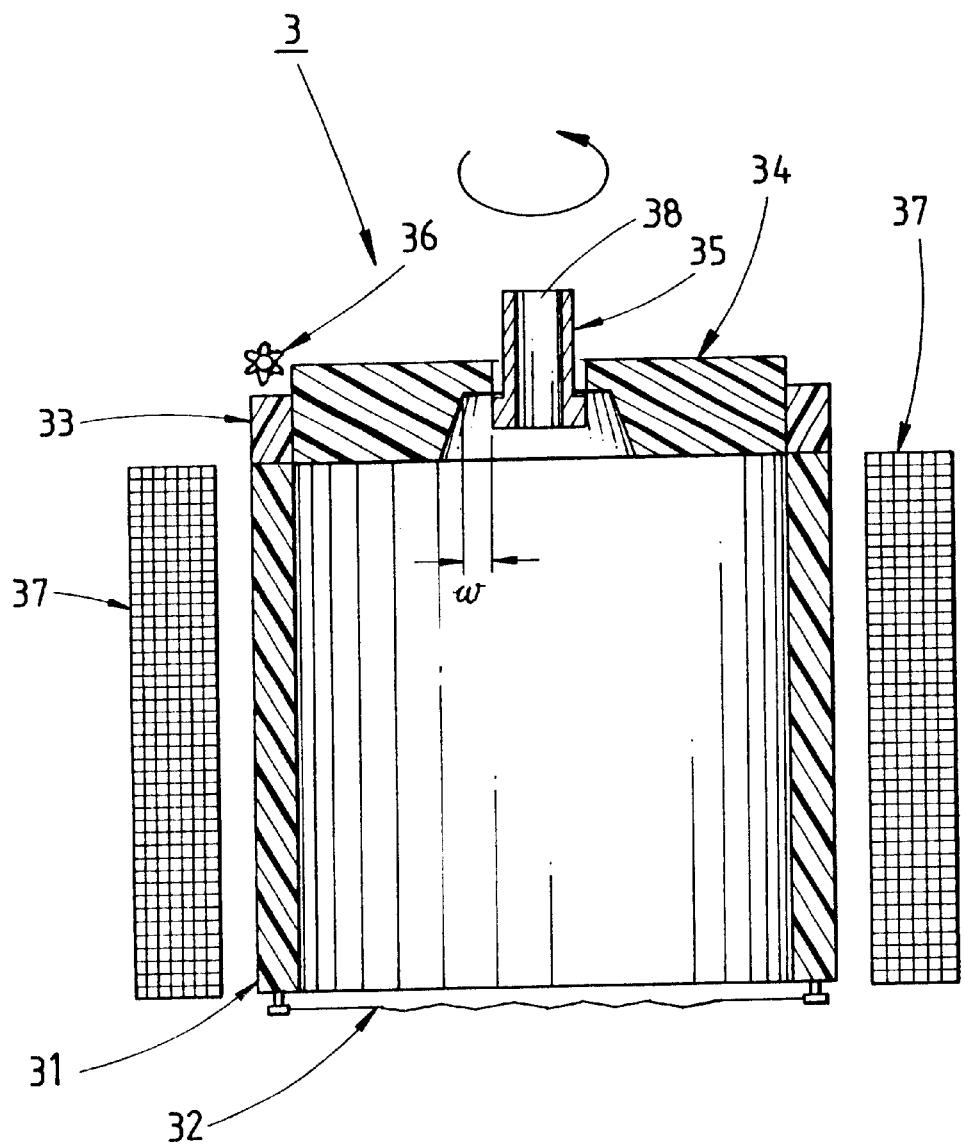
FIG. 3 is a partially magnified cross-sectional drawing of the tetrafluoroethylene plastic sputtering target of the invention herein.

Regarding the structure of tetrafluoroethylene plastic target 3 of the invention herein that is utilized in the contamination-resistant thin film deposition method, as indicated in FIG. 3, the said tetrafluoroethylene plastic target 3 essentially consists of a non-conductive organic tetrafluoroethylene plastic material capable of rapidly sputtering the substrate 7 (as shown in FIG. 2); the said structure is also comprised of a negative substrate 31, a filiform electrode 32, an insulative support 33, a tetrafluoroethylene plastic sputtering substrate 34, a positive substrate 35, a tetrafluoroethylene plastic substrate rotating device 36, a magnetic field generator 37, and a gas input port 38.

When electrically charged, the said negative substrate 31 produces an oxygen and argon electrophoretic gel and, when the oxygen electrophoretic gel contacts the tetrafluoroethylene plastic, the surface energy of the negative substrate 31 increases within a short period, which improves the contact capability between the tetrafluoroethylene plastic and the substrate, and the argon electrophoretic gel produces a 1,000-Angstrom beam of ultraviolet light that supplies energy down to a certain depth of the surface material to cause bridging and polymerization; furthermore, with a negative device, like a smoke stack, assisting throughout the process in the prevention of scattering as the thin film is applied to the substrate surface.

The said filiform electrode 32 is a cross-sectionally diminutive alloy of tungsten and 0.5-percent thorium that very easily radiates thermoelectrons, which assists in triggering an electrical charge that produces collisions with the substrate and the surface of the tetrafluoroethylene plastic; when the rate of tetrafluoroethylene plastic thin film production on the said substrate surface exceeds the loss rate, a thin film deposition is formed on the substrate surface.

A 2 mm to 5 mm interval "ω" (as indicated in FIG. 3) is left in between the said tetrafluoroethylene plastic substrate 34 and the positive substrate 35, which assists in generation of a positive glow and effectively utilizes the Faraday positive shaded region effect to invoke collisions off the tetrafluoroethylene plastic.

Figure 4:
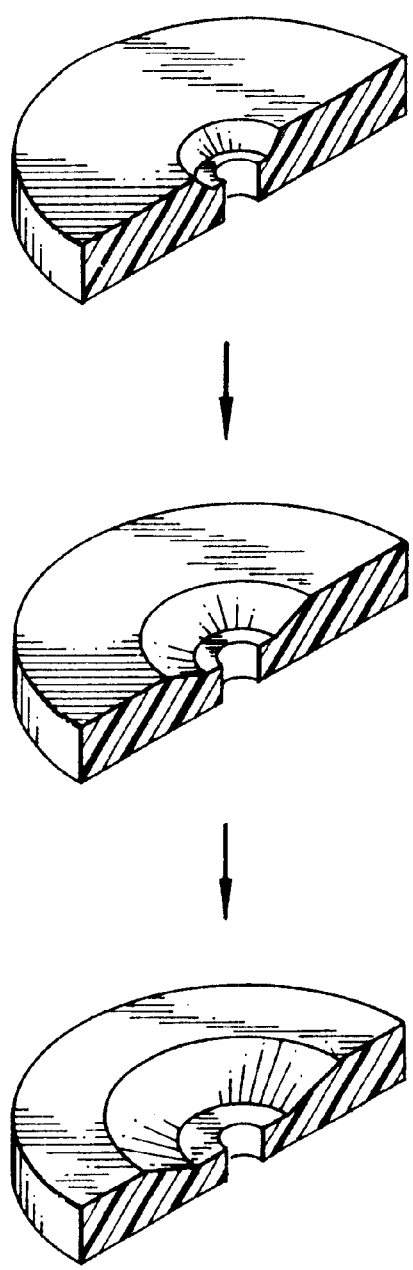
FIG. 4 is an isometric drawing of the tetrafluoroethylene plastic sputtering target of the invention herein in the successive stages of degradation.

The tetrafluoroethylene plastic substrate rotating device 36 is utilized to prevent the uneven mass loss of the tetrafluoroethylene plastic from collisions (as indicated in FIG. 4); and having profile is similar to that of the filiform electrode 32, the said rotating device 36 increases the utilization efficiency of the plastic substrate, the improvement of which requires rotation.

The said positive substrate 35 is internally hollow to facilitate the input of oxygen and argon gas; furthermore, the vacuum pressure at the point of the gas input is greater than the vacuum inside the vacuum chamber 2 and, furthermore the close proximity of the gases with the positive substrate 35 assists the action of the electrical charge, with the oxygen and argon molecular ionization occurring between both of them, the high energy oxygen ions and the thermoelectrons of the filiform electrode 32 collide off the said tetrafluoroethylene plastic substrate 34 and then, the light and heat and radiation lines from the electrophoretic gel cause re-polymerization over the substrate surface.

The said magnetic field generator 37 utilizes an orthogonally combined electrical and magnetic force to increase the collision frequency and the ionization ratio.

As the substrate 7 undergoes the contamination-resistant thin film deposition method by the said equipment, the tetrafluoroethylene plastic sputtering target 3 can consist of a non-conductive tetrafluoroethylene plastic or most other organic materials such as nylon and silicon plastic that are capable of applying layers of contamination-resistant thin film at a high sputtering rate, which is suitable for applications in the high function surface treatment industry to keep product exteriors sparkling clean and newer looking longer, while also providing effective corrosion-resistance and contamination-resistance.

The contamination-resistant thin film deposition method of the invention herein is capable of processing transparent contamination-resistant glass, which consists of utilizing the $(CF_2 \cdot CF_2)m(ITO)n$ compound of the method of invention herein to apply a thin film deposition onto a glass substrate. Glass produced according to the said method has special contamination-resistant and transparent features. Conventional glass contains sodium ions and, therefore, is not acid-resistant and, furthermore, absorbs moisture. Moreover, sodium ions are susceptible to ionic exchange, which results in superficial concavities and convexities so as to loss its original luster. A material having high insulator characteristics, glass is subject to static electricity build-up which attracts dust and dirt, and the resulting residue is difficult to clean. However, the aforesaid contamination-resistant thin film of the invention herein is a compound of transparent organic $(CF_2 \cdot CF_2)m$, $(ITO)n$, or $(ATO)n$, which contains such tetrafluoroethylene plastic features as non-adhesiveness, weather-resistance, water dispersing, organic solvent-resistant and chemical-proof properties, which makes various contaminant adherence difficult. However, since the glass is still a highly efficient insulator and generate static electricity and attraction, high translucent, low impedance ITO (ATO) is added to reduce surface impedance, which prevents the generation of static electricity induce attraction and achieves the objective of contamination resistance. Furthermore, because the thickness of the organic tetrafluoroethylene plastic is within 1,000 Angstroms, which maintains a light transmission rate of more than 90 percent with little absorption and low refraction. As such, the glass substrate has excellent properties of optical transparency and when exposed to the elements for extended periods it is not susceptible to water absorption, static electricity, chemical substances (acids and salts), or oil and dust pollution. The said transparent contamination-resistant glass can be utilized as a construction material (door window and screening glass, etc.), optical windows, television screens, computer monitor screens, and automobile windows that features the long-term preservation of glass surface luster, shine, and transparency.

The contamination-resistant thin film deposition method of the invention herein is capable of processing transparent self-purifying glass by applying the thin film deposition according the said method utilizing a $TiO_2$ target instead of an ITO target and, furthermore, adding a 0.1 mol of nitrogen to the admitted oxygen or argon gas to cause the formation of sharp mineralized titanium crystals due to the effect of nitrogen on $TiO_2$ and which produces a layer of $(CF_2 \cdot CF_2)$ m$(TiO_2)$n compound thin film deposition that is formed through sputtering on the surface of the glass substrate; and the said sharp mineralized titanium crystals are within the light spectrum of optical transparency, but have a high absorption rate in the ultraviolet region, a characteristic that blocks the transmission of ultraviolet light rays; when the sun shines on the earth, the shortest radiated wavelength is 290 nm and, after the ultraviolet light rays are absorbed by the $TiO_2$ (light catalyst), the ultraviolet light rays radiated causes oxygen to change into ozone in the air; and the light, heat, and ozone causes a slow process of oxidation and disinfection in many saturated and unsaturated organic matter, including the oxidizing and disintegration of minute amounts of oil residue, which is how the objective of self-purification is achieved; furthermore, since the tetrafluoroethylene plastic has the characteristics of extremely low surface energy and high non-adhesiveness so that foreign substances do not readily adhere; moreover, wind, rainfall, and sunlight serve as catalysts that facilitate the achievement of the self-purification function. Utilized as a surface improvement, the glass is not susceptible to moisture, static electricity, chemical substance (acid and salts, etc.), or oil and dust pollution and, furthermore, filters out harmful ultraviolet rays; furthermore, the said transparent self-purifying glass can be utilized as a construction material (door window and screening glass, etc.), optical windows, television screens, computer monitor screens, automobile windows, medical treatment and food product glass that features the long-term preservation of glass surface luster, shine, and transparency.

The contamination-resistant thin film deposition method of the invention can be utilized in the fabrication of contamination-proof metal doors, window frames, fences, and other construction materials in that the said method is capable of applying a contamination-resistant thin film $(CF_2 \cdot CF_2)$m$(ITO)$n compound deposition on metal doors, window frame, and railing substrate surfaces of a ferrous or non-ferrous metal composition. Since the said contamination-resistant thin film requires a vacuum environment for production, the substrate surfaces must first be free of air before the application of the contamination-resistant thin film layer, and the thin film formed has high density and powerful adhesive characteristics and, furthermore, due to the ions in the electrophoretic gel during sputtering, the thin film has even distribution characteristics and, furthermore, can be applied to surfaces that are irregular or have concavities or convexities; doors, windows, railings of complex shape as well as their components can be finished with a protective layer of contamination-resistant thin film to improve long-term exposure durability in open-air environments, with ferrous or non-ferrous material doors, windows, railings becoming oxidation-resistant, anti-static, waterproof, moisture-proof, ocean wind-resistant, and dust-resistant; utilized in the construction materials industry, the invention herein prolongs the limited number of utilization years, preserves a clean and new appearance, and luster, while also reducing maintenance time and lowering maintenance costs.

The contamination-resistant thin film deposition method of the invention can be utilized in the production of contamination-resistant ceramic tile or plastic wallpaper that have static-resistant, dust-resistant, water dispersing, and non-adhesive characteristics and, similar to the method of fabrication disclosed in the foregoing section, the said method consists of depositing a $(CF_2 \cdot CF_2)$ m$(TIO_2)$n or $(CF_2 \cdot CF_2)$m$(ITO)$n compound thin film on the substrate 7 of ceramic tile, glazed tile, and natural stone material or plastic wallpaper to achieve non-stick, weather resistance, chemical resistance, anti-static, and contamination resistance capability such that when utilized as construction exterior or interior surface ceramic tiles, plastic wallpaper, or glazed roof tiles to improve building appearance and to protect such surfaces from pollution, and the newness and luster of the building is preserved longer; furthermore, building exterior surface maintenance cost is reduced and the hazards of high-elevation building cleaning can be avoided; with regard to the dust-free clean rooms and plants of the high technology industry, it is only necessary to adjust the mole ratios of $(CF_2 \cdot CF_2)$m and $(ITO)$n until an impedance of $10^4 \Omega$-cm is reached, at which time inside the dustless clean room the anti-static, inflammable, non-adhesive, and chemical solvent-resistant characteristics are achieved.

The contamination-resistant thin film deposition method of the invention can be utilized in the production of dry-type contamination-resistant lubricated precision machinery components by depositing a $(CF_2 \cdot CF_2)$ m$(ITO)$n compound thin film on the surface of a ferrous or non-ferrous metal precision machinery component substrate materials to produce dry-type contamination-resistant lubricated precision machinery components; and due to the non-sticking properties of tetrafluoroethylene plastic ingredient in the said thin film, there is extremely low friction coefficient and high lubrication; furthermore, since the said thin film is formed in a vacuum, the high density and excellent deposition characteristics are exceptional, with the inorganic ITO compound contained also capable of increasing thin film hardness, which addresses the shortcomings of conventional mechanical components such as oxidation induced corrosion, increased friction due to loosening, rapid mechanical wear, and heat expansion during rotation that affects the usable service life limits of mechanical components; the dry-type contamination-resistant lubricated precision machinery components of the invention herein improves upon the aforementioned shortcomings and, furthermore, provides resistance to chemical agents and solvents to prevent mechanical component deterioration and failure, and thereby assists in lessening mechanical component wear during machine transport and operation; the self-lubrication capabilities are especially apparent during machinery rotation and operation, which reduces damage to mechanical components due to heat generated by friction; the said dry-type contamination-resistant lubricated precision machinery components can be utilized in the instruments industry, optoelectronic industry, precision machinery industry, and other fields of manufacturing that require mechanical components having a high degree of dimensional accuracy, low noise characteristics, and, furthermore, easy to maintain.

What is claimed is:

1. A contamination-resistant thin film deposition method using a vacuum pump, a vacuum chamber, a tetrafluoroethylene plastic sputtering target, a transparent conductor sputtering target, a gaseous flow rate controller, and a substrate application platform that are utilized in a reaction-type vacuum sputtering process to apply a deposition of a contamination-resistant thin film layer onto a surface of one of a ferrous, non-ferrous, glass, ceramic, plastic and natural stone material substrate, said tetrafluoroethylene sputtering target and said transparent conductor sputtering target being configured within said vacuum chamber prior to said deposition, the contamination-resistance thin film deposition method comprising the steps of:

ultrasonic cleaning of said substrate, placing said substrate on said application platform inside said vacuum chamber, switching on said vacuum pump to achieve a vacuum pressure of $1 \times 10^{-5}$ Torr, admitting oxygen ($O_2$) and argon (Ar) gas into the vacuum chamber to maintain an equilibrium pressure of $3 \times 10^{-3}$ Torr, switching on a respective driving current and voltage for said tetrafluoroethylene plastic sputtering target and said transparent conductor sputtering target to control the sputtering rate of said two sputtering targets, following completion of said contamination-resistant thin film, switching off the respective driving current and voltage of said two sputtering targets and then removing said substrate for inspection and packaging, and rapidly sputtering a non-conductive organic tetrafluoroethylene plastic on said substrate to form a tetrafluoroethylene plastic thin film by a sputtering device comprised of a negative potential applied to said substrate, a filiform electrode, an insulative support, a tetrafluoroethylene plastic substrate, a positive substrate, a tetrafluoroethylene plastic substrate rotating device, a magnetic field generator, and a gas input port, said tetrafluoroethylene plastic sputtering target utilizing electrons released from a high energy electrophoretic gel of a Faraday dark region and from said filiform electrode to collide off said tetrafluoroethylene plastic forming ions going through a stack-shaped electrophoretic gel area for polymerization, and the electrophoretic gel greatly increasing the surface energy within a short time to improve a surface contact capability between said substrate and the anti-contamination thin film, and argon ions generated in said electrophoretic gel producing a 1,000-Angstrom beam of ultraviolet light suppling energy to said tetrafluoroethylene ions to produce bridging and polymerization enabling the application of said non-stick tetrafluoroethylene plastic deposition to one of ferrous metals, non-ferrous metals, ceramic, glass, plastic wallpaper, and natural stone material substrate surfaces as a contamination-resistant thin film surface treatment.

2. The contamination-resistant thin film deposition method of claim 1, further comprising applying on the surface of glass a thin film to produce a transparent contamination-resistance glass.

3. The contamination-resistant thin film deposition method of claim 1, further comprising producing a transparent glass by utilizing a transparent conductive sputtering target and, furthermore, introducing 0.1 mol of nitrogen to the admitted oxygen or argon gas during the sputtering process to cause the formation of sharp mineralized titanium crystals due to the effect of nitrogen on $TiO_2$ and which forms a layer of contamination-resistant thin film deposition on the surface of the glass substrate that is transparent and.

4. The contamination-resistant thin film deposition method of claim 1, further comprising sputtering a deposition layer on ferrous or non-ferrous metal door, window frames, and railings.

5. The contamination-resistant thin film deposition method of claim 1, further comprising producing a contamination-resistant ceramic tile or plastic wallpaper by adjusting a mole ratio during the sputtering process to enable the contamination-resistant thin film deposited on the surface of said ceramic tile or said plastic wallpaper to have anti-static and contamination-proof capabilities.

6. The contamination-resistant thin film deposition method of claim 1, further comprising producing contamination-resistant lubricated precision machinery components by depositing a thin film on a surface of ferrous or non-ferrous metal precision machinery component substrate materials to produce contamination-resistant lubricated precision machinery components to increase friction resistance, corrosion resistance, and lubrication capabilities.

\* \* \* \* \*